(12) United States Patent
Berens (10) Patent No.: US 8,513,516 B2
(45) Date of Patent: Aug. 20, 2013

(54) INTRA-LAMINATE DISK LAYER FOR THIN FILM PHOTOVOLTAIC DEVICES AND THEIR METHODS OF MANUFACTURE

(75) Inventor: Troy Alan Berens, Evergreen, CO (US)

(73) Assignee: Primestar Solar, Inc., Arvada, CO (US)

( * ) Notice: Subject to any disclaimer, the term of this patent is extended or adjusted under 35 U.S.C. 154(b) by 213 days.

(21) Appl. No.: 12/870,013

(22) Filed: Aug. 27, 2010

(65) Prior Publication Data
US 2012/0024349 A1 Feb. 2, 2012

(51) Int. Cl.
*H01L 31/0203* (2006.01)

(52) U.S. Cl.
USPC ........... 136/251; 136/256; 136/259; 174/520; 174/521

(58) Field of Classification Search
USPC ............. 136/251, 259, 256; 438/64, 66, 438/67; 174/520, 521
See application file for complete search history.

(56) References Cited

U.S. PATENT DOCUMENTS

| | | | | |
|---|---|---|---|---|
| 4,371,739 | A * | 2/1983 | Lewis et al. | 136/251 |
| 5,022,930 | A | 6/1991 | Ackerman et al. | |
| 6,169,246 | B1 * | 1/2001 | Wu et al. | 136/265 |
| 6,469,242 | B1 * | 10/2002 | Kondo | 136/251 |
| 2009/0194165 | A1 | 8/2009 | Murphy et al. | |
| 2011/0073362 | A1 * | 3/2011 | Shimizu | 174/520 |

FOREIGN PATENT DOCUMENTS

WO WO 2009/148078 * 12/2009

* cited by examiner

*Primary Examiner* — Jonathan Johnson
*Assistant Examiner* — Christina Chern
(74) *Attorney, Agent, or Firm* — Dority & Manning, P.A.

(57) ABSTRACT

Photovoltaic devices including an insulating layer and an intra-laminate disk layer on a plurality of thin film layers are provided. A first conductive strip, defining a first lead, is positioned on the insulating layer and connected to a first bus bar. A second conductive strip is positioned on the insulating layer and connected to a second bus bar. An adhesive layer is over the device and defines an adhesive gap through which the first lead and the second lead extend. An encapsulating substrate is on the adhesive layer, and defines a connection aperture through which the first lead and the second lead extend. The intra-laminate disk layer is positioned under the adhesive gap defined by the adhesive layer and the connection aperture defined by the encapsulating substrate.

Methods of manufacturing photovoltaic devices are also provided.

14 Claims, 12 Drawing Sheets

INTRA-LAMINATE DISK LAYER FOR THIN FILM PHOTOVOLTAIC DEVICES AND THEIR METHODS OF MANUFACTURE

FIELD OF THE INVENTION

The subject matter disclosed herein relates generally to photovoltaic devices including an intra-laminate disk layer positioned to inhibit moisture ingress, particularly through a hole in the encapsulating substrate.

BACKGROUND OF THE INVENTION

Thin film photovoltaic (PV) modules (also referred to as "solar panels") based on cadmium telluride (CdTe) paired with cadmium sulfide (CdS) as the photo-reactive components are gaining wide acceptance and interest in the industry. CdTe is a semiconductor material having characteristics particularly suited for conversion of solar energy to electricity. The junction of the n-type layer and the p-type layer is generally responsible for the generation of electric potential and electric current when the CdTe PV module is exposed to light energy, such as sunlight. Specifically, the cadmium telluride (CdTe) layer and the cadmium sulfide (CdS) form a p-n heterojunction, where the CdTe layer acts as a p-type layer (i.e., a positive, electron accepting layer) and the CdS layer acts as a n-type layer (i.e., a negative, electron donating layer).

A transparent conductive oxide ("TCO") layer is commonly used between the window glass and the junction forming layers. This TCO layer provides the front electrical contact on one side of the device and is used to collect and carry the electrical charge produced by the cell. Conversely, a back contact layer is provided on the opposite side of the junction forming layers and is used as the opposite contact of the cell. This back contact layer is adjacent to the p-type layer, such as the cadmium telluride layer in a CdTe PV device.

An encapsulating substrate is positioned on the opposite side of the device to encase the thin film layers between the window glass and the encapsulating substrate. The encapsulating substrate typically contains a hole that enables connection of the photovoltaic device to lead wires for the collection of the DC electricity created by the PV device. However, since PV devices are typically used outside, the PV devices are subjected to varying environmental conditions and exposed to humidity, dew, rain, and other moisture exposure. The hole in the encapsulating substrate can be particularly susceptible to moisture ingress into the device. Such moisture can reduce the efficiency of the PV device and significantly shorten its effective lifespan.

As such, a need exists to inhibit and prevent moisture ingress into the PV device, particularly at the hole in the encapsulating substrate.

BRIEF DESCRIPTION OF THE INVENTION

Aspects and advantages of the invention will be set forth in part in the following description, or may be obvious from the description, or may be learned through practice of the invention.

Photovoltaic devices are generally provided that include a plurality of thin film layers on a glass substrate, wherein the plurality of thin film layers define a plurality of photovoltaic cells connected in series to each other. An insulating layer and an intra-laminate disk layer can be on the plurality of thin film layers. A first conductive strip, defining a first lead, is positioned on the insulating layer to be electrically isolated from the plurality of thin film layers, and is connected to a first bus bar. A second conductive strip, defining a second lead, is positioned on the insulating layer to be electrically isolated from the thin film layers, and is connected to a second bus bar. An adhesive layer is over the first conductive strip, the second conductive strip, the intra-laminate disk layer, the insulated layer, and any remaining exposed areas of the plurality of thin films. The adhesive layer defines an adhesive gap through which the first lead and the second lead extend. Finally, an encapsulating substrate is on the adhesive layer, and defines a connection aperture through which the first lead and the second lead extend. The intra-laminate disk layer is positioned under the adhesive gap defined by the adhesive layer and the connection aperture defined by the encapsulating substrate.

Methods of manufacturing photovoltaic devices are also provided. According to these methods, an insulating layer and an intro-laminate disk layer can be applied on a plurality of thin film layers overlying a substrate. A conductive strip can be applied on the insulating layer such that the conductive strip is electrically isolated from the plurality of thin film layers, and can be severed to form a first conductive strip defining a first lead and a second conductive strip defining a second lead. The first conductive strip can be connected to a first bus bar, and the second conductive strip can be connected to a second bus bar. An adhesive layer can then be applied over the first conductive strip, the second conductive strip, the intra-laminate disk layer, the insulated layer, and any remaining exposed areas of the plurality of thin films. The adhesive layer defines an adhesive gap through which the first lead and the second lead extend. Finally, an encapsulating substrate is attached to the adhesive layer. The encapsulating substrate defines a connection aperture through which the first lead and the second lead extend. The intra-laminate disk layer is positioned under the adhesive gap defined by the adhesive layer and the connection aperture defined by the encapsulating substrate.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which.

DETAILED DESCRIPTION OF THE INVENTION

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

In the present disclosure, when a layer is being described as "on" or "over" another layer or substrate, it is to be understood that the layers can either be directly contacting each other or have another layer or feature between the layers. Thus, these terms are simply describing the relative position of the layers to each other and do not necessarily mean "on top of" since the relative position above or below depends upon the orientation of the device to the viewer. Additionally, although the invention is not limited to any particular film thickness, the term "thin" describing any film layers of the photovoltaic device generally refers to the film layer having a thickness less than about 10 micrometers ("microns" or "μm").

It is to be understood that the ranges and limits mentioned herein include all ranges located within the prescribed limits (i.e., subranges). For instance, a range from about 100 to about 200 also includes ranges from 110 to 150, 170 to 190, 153 to 162, and 145.3 to 149.6. Further, a limit of up to about 7 also includes a limit of up to about 5, up to 3, and up to about 4.5, as well as ranges within the limit, such as from about 1 to about 5, and from about 3.2 to about 6.5.

A thin film photovoltaic device is generally provided having an intra-laminate disk layer positioned to inhibit moisture ingress, particularly through a hole in the encapsulating substrate utilized to collect the DC electricity generated by the PV device.

Figure 3:
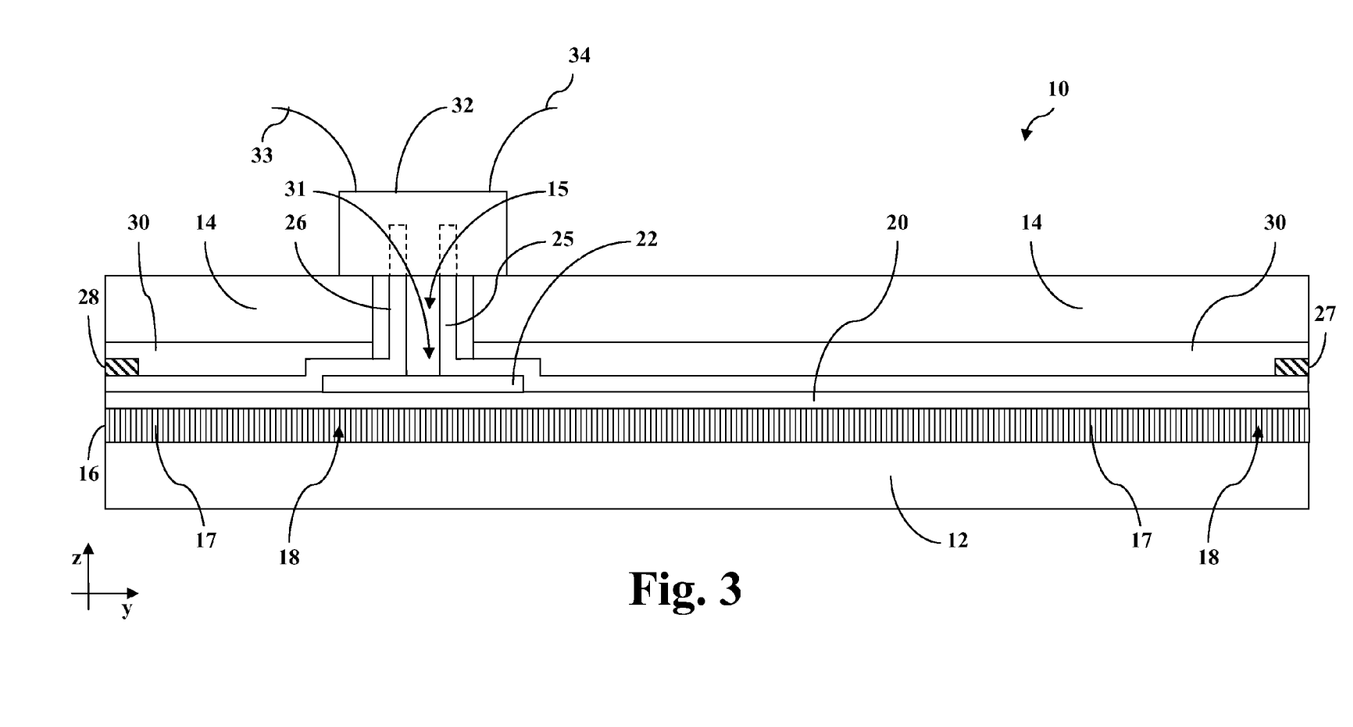
FIG. 3 shows a shows a cross-sectional view of the exemplary thin film photovoltaic device of FIG. 1 having a junction box attached to the encapsulating substrate at its connection aperture.

FIG. 3 shows a cross-sectional view of an exemplary thin film photovoltaic device 10. The photovoltaic device 10 generally includes a glass substrate 12 oppositely positioned from an encapsulating substrate 14. In this embodiment, the glass 12 can be referred to as a "superstrate," as it is the substrate on which the subsequent layers are formed even though it faces upward to the radiation source (e.g., the sun) when the cadmium telluride thin film photovoltaic device 10 is in use. The top sheet of glass 12 can be a high-transmission glass (e.g., high transmission borosilicate glass), low-iron float glass, or other highly transparent glass material. The glass is generally thick enough to provide support for the subsequent film layers (e.g., from about 0.5 mm to about 10 mm thick), and is substantially flat to provide a good surface for forming the subsequent film layers. In one embodiment, the glass 12 can be a low iron float glass containing less than about 0.015% by weight iron (Fe), and may have a transmissiveness of about 0.9 or greater in the spectrum of interest (e.g., wavelengths from about 300 nm to about 900 nm). In another embodiment, borosilicate glass may be utilized so as to better withstand high temperature processing.

The encapsulating substrate 14 defines a connection aperture 15 providing access to the underlying components to collect the DC electricity generated by the photovoltaic device 10. In one particular embodiment, the encapsulating substrate 14 is a glass substrate.

A plurality of thin film layers 16 are positioned on the glass substrate 12. The plurality of thin film layers 16 define individual photovoltaic cells 17 separated by scribes 18. The individual photovoltaic cells 17 are electrically connected together in series. In one particular embodiment, the plurality of thin film layers can include a transparent conductive oxide layer (e.g., cadmium stannate or stoichiometric variation of cadmium, tin, and oxygen) on the glass substrate 12, a resistive transparent buffer layer (e.g., a combination of zinc oxide and tin oxide) on the transparent conductive oxide layer, an n-type layer on the resistive transparent buffer layer, a p-type layer on the n-type layer, and a back contact on the p-type layer. The n-type layer can include cadmium sulfide (i.e., a cadmium sulfide thin film layer), and the p-type layer can include cadmium telluride (i.e., a cadmium telluride thin film layer). Generally, the back contact defines the exposed surface of the thin film layers 16, and serves as an electrical contact of the thin film layers opposite the front contact defined by the transparent conductive oxide layer.

Figure 4:
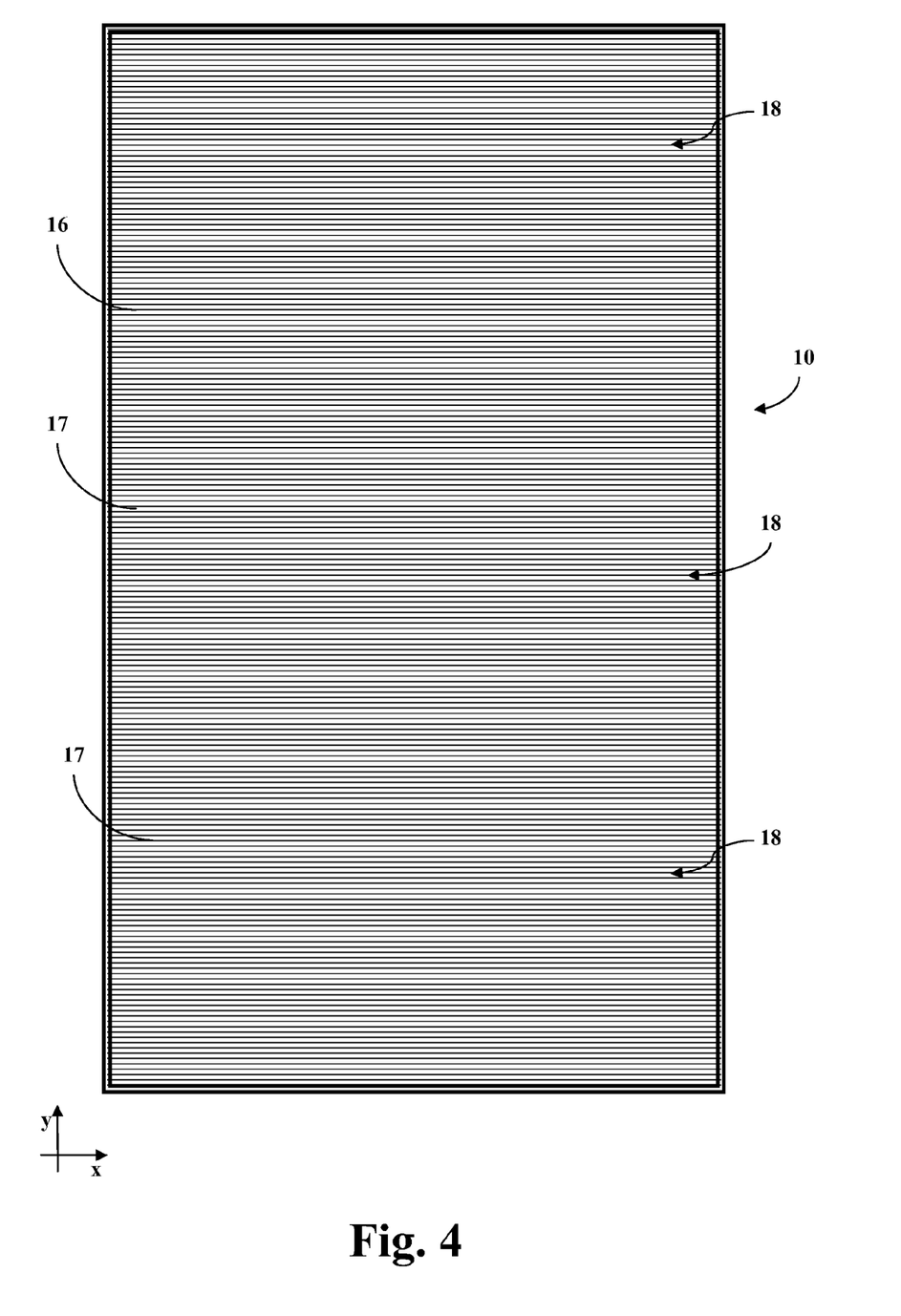
FIG. 4 shows a top view of an exemplary thin film photovoltaic device defining a plurality of cells.

For instance, FIG. 4 generally shows a top view of an exemplary thin film photovoltaic device 10 defining a plurality of photovoltaic cells 17 separated by scribes 18. The scribes 18 can be, in one embodiment, substantially parallel to each other such that the photovoltaic cells 17 are substantially the same size. As shown, each of the scribes 18 is generally oriented in the x-direction.

An insulating layer 20 is on the thin film layers 16 to protect the back contact of the thin film layers 16. The insulating layer 20 generally includes an insulating material that can prevent electrical conductivity therethrough. Any suitable material can be used to produce the insulating layer 20. In one embodiment, the insulating layer 20 can be an insulating polymeric film coated on both surfaces with an adhesive coating. The adhesive coating can allow for adhesion of the insulating layer 20 to the underlying thin film layers 16 and for the adhesion of the conductive strip 24 to the insulating layer 20. For example, the insulating layer 20 can include a polymeric film of polyethylene terephthalate (PET) having an adhesive coating on either surface. The adhesive coating can be, for example, an acrylic adhesive, such as a thermosetting acrylic adhesive.

Figure 5:
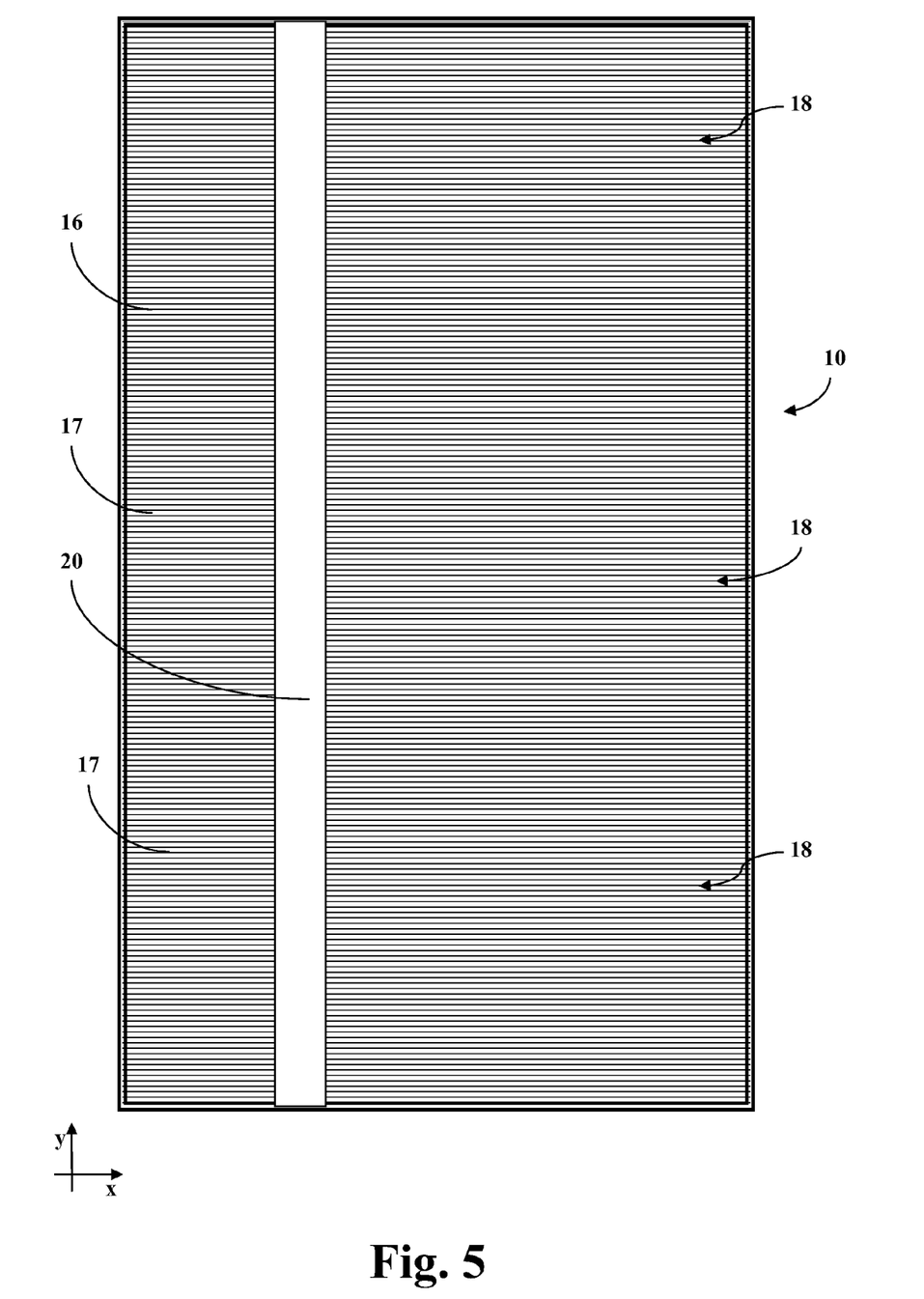
FIG. 5 shows a top view of the exemplary photovoltaic device of FIG. 4 having an insulating layer on the photovoltaic cells.

In one particular embodiment, the insulating layer 20 is a strip of insulating material generally oriented in a direction perpendicular to the orientation of the scribes 18. For example, as shown in FIG. 5, the insulating layer 20 can be generally oriented in the y-direction that is perpendicular to the orientation of the scribes 18 in the x-direction.

The insulating layer 20 can have a thickness in the z-direction suitable to prevent electrical conductivity from the underlying thin film layers, particularly the back contact, to any subsequently applied layers. In one particular embodiment, the insulating layer 20 can prevent electrically conductivity between the thin film layers 16 and the conductive strip 24.

The intra-laminate disk layer 22 is positioned on the thin film layers 16 over an area to be exposed by the connection aperture 15 of the encapsulating substrate 14. For example, the intra-laminate disk layer 22 can extend over a protected area (as defined in the x- and y-directions on the surface of the thin film layers 16) that is larger than the connection aperture 15 defined by the encapsulating substrate 14 and/or that is that is larger than the adhesive gap 31 defined by the adhesive layer 30.

In one embodiment, the intra-laminate disk layer 22 defines a substantially circular disk in the x, y plane. This shape can be particularly useful when both the adhesive gap 31 defined in the adhesive layer 30 and the connection aperture 15 in the encapsulating substrate 14 are also substantially circular in the x, y plane. As such, the intra-laminate disk layer 22 can be substantially centered with respect to the adhesive gap 31 defined by the adhesive layer 30 and to the connection aperture 15 defined by the encapsulating substrate 14. Also, with this configuration, the disk diameter of the intra-laminate disk layer 22 can be larger than the gap diameter defined by the adhesive gap 31 and/or the aperture diameter defined by the connection aperture 15. For instance, the disk diameter can be at about 5% larger to about 200% larger than the gap diameter and/or the connection diameter, such as about 10% larger to about 100% larger.

The intra-laminate disk layer can define a thickness, in the z-direction, of about 50 μm to about 400 μm.

The intra-laminate disk layer 22, in one embodiment, can be constructed of a film having a polymeric coating on one or both surfaces. The polymeric coating can include a hydrophobic polymer configured to moisture ingress through the intra-laminate disk layer 22 and/or around the intra-laminate disk layer 22. In addition, the polymeric coating can help adhere the intra-laminate disk layer 22 to the underlying layers (e.g., the thin film layers 16) and subsequently applied layers (e.g., the adhesive layer 30). In one particular embodiment, the polymeric coating can include an ethylene-vinyl acetate copolymer.

The film can of the intra-laminate disk layer 22 can be a polymeric film. The polymeric film can include the same polymer as the polymeric coating or a different polymer. In one particular embodiment, the film can be a polymeric film, including polymers such as polyethylene, polypropylene, polyethylene terephthalate (PET), ethylene-vinyl acetate copolymer, or copolymers or mixtures thereof.

Figure 6:
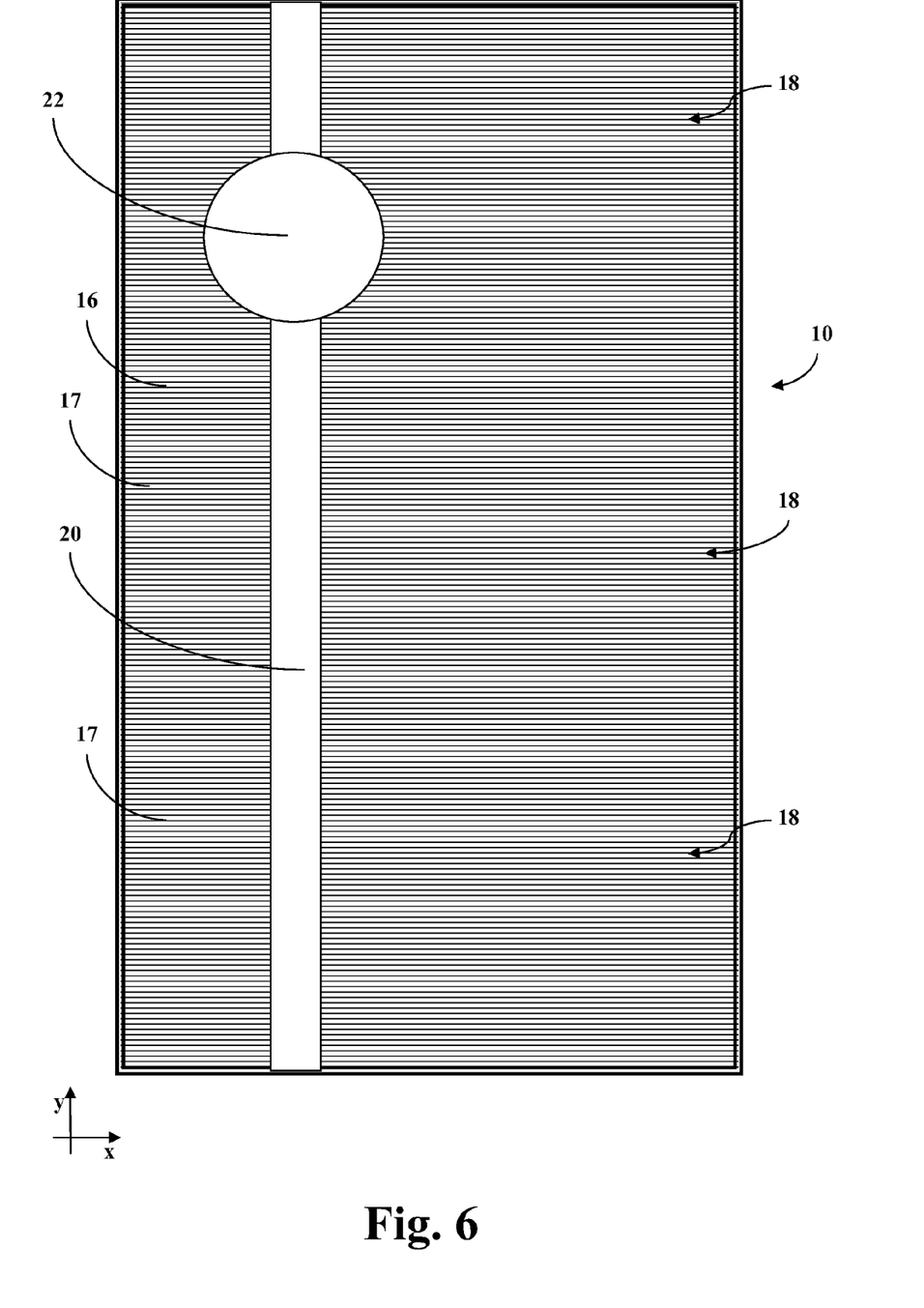
FIG. 6 shows a top view of the exemplary photovoltaic device of FIG. 5 with an intra-laminate disk layer.

The intra-laminate disk layer 22 can be applied after the insulating layer 20, such as shown in FIGS. 5-6 to result in the embodiment of FIG. 3. Alternatively, the intra-laminate disk layer 22 can be applied before the insulating layer 20 (e.g., directly onto the plurality of thin film layers 16), such as shown in FIGS. 11-14. In particular, FIGS. 11-14 show another exemplary thin film photovoltaic device 100 where the intra-laminate disk layer 22 is beneath the insulating layer 20 and directly over the plurality of thin film layers 16.

Figure 7:
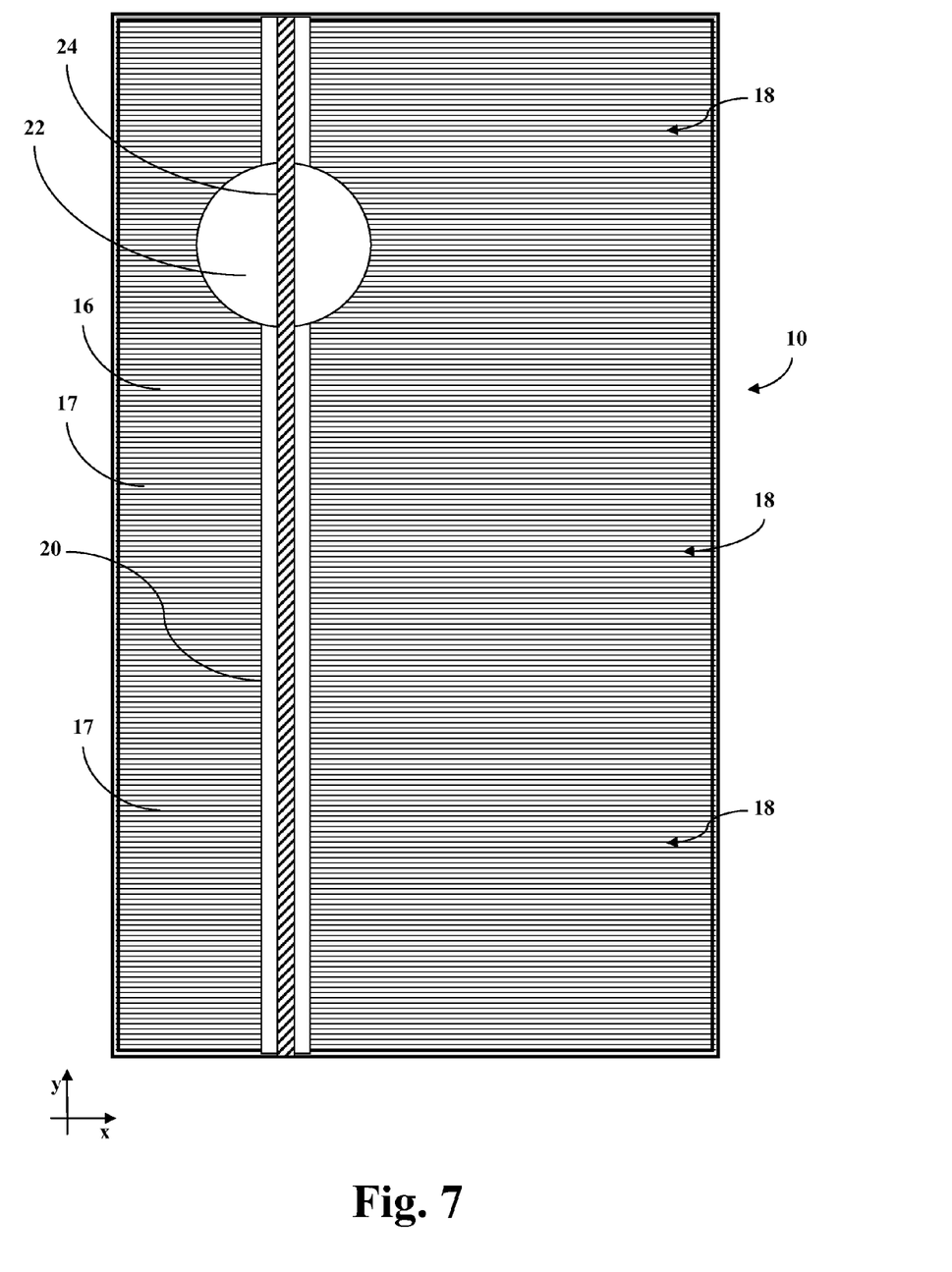
FIG. 7 shows a top view of the exemplary photovoltaic device of FIG. 6 with a conductive strip applied on the insulating strip.
Figure 8:
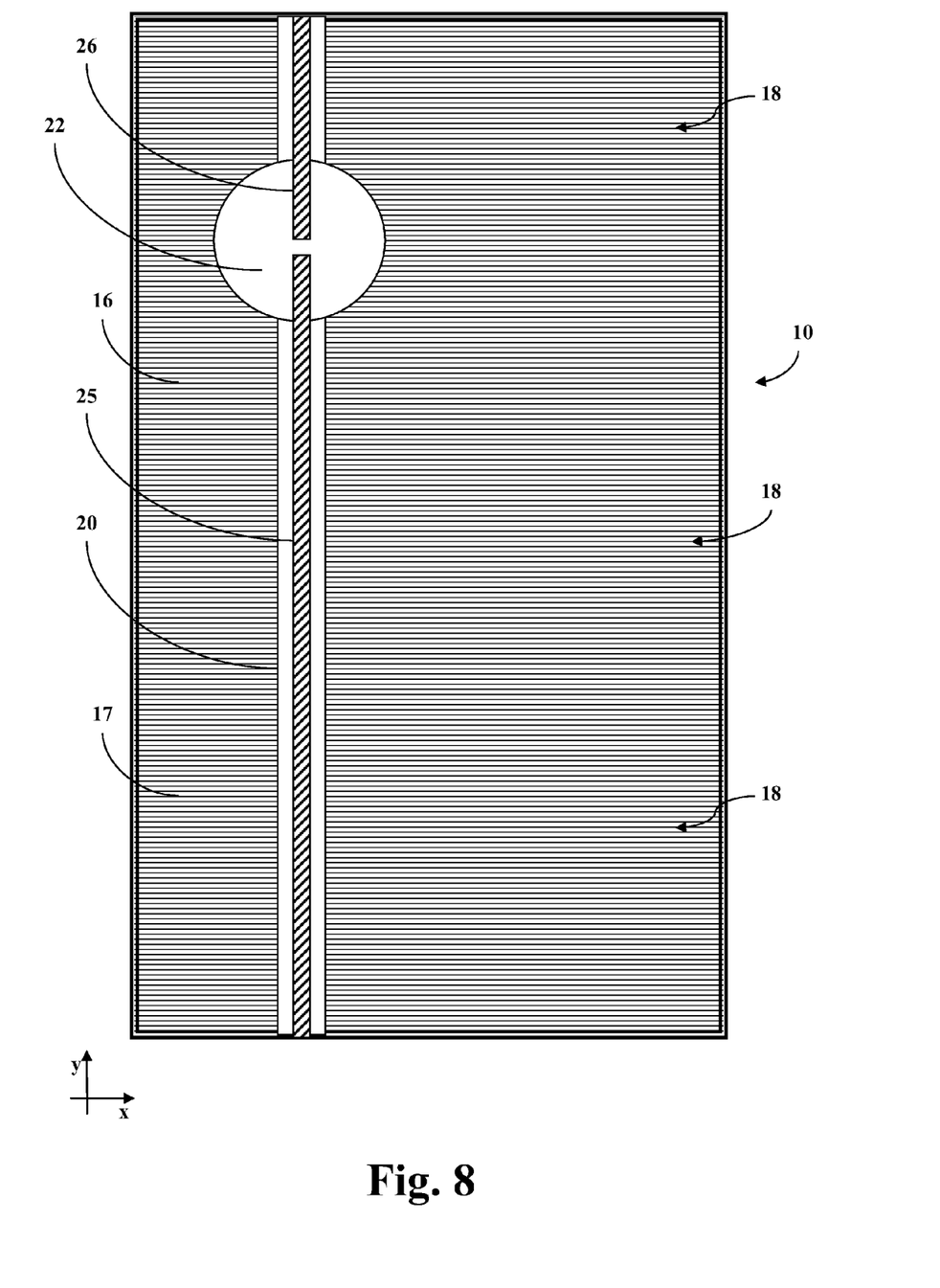
FIG. 8 shows a top view of the exemplary photovoltaic device of FIG. 7 with the conductive strip severed.

The conductive strip 24, in one embodiment, can be applied as a continuous strip over the insulating layer 20, as shown in FIG. 7. Then, the continuous strip can then be severed to produce a first lead 25 and a second lead 26.

The conductive strip 24 can be constructed from any suitable material. In one particular embodiment, the conductive strip 24 is a strip of metal foil. For example, the metal foil can include a conductive metal.

Figure 9:
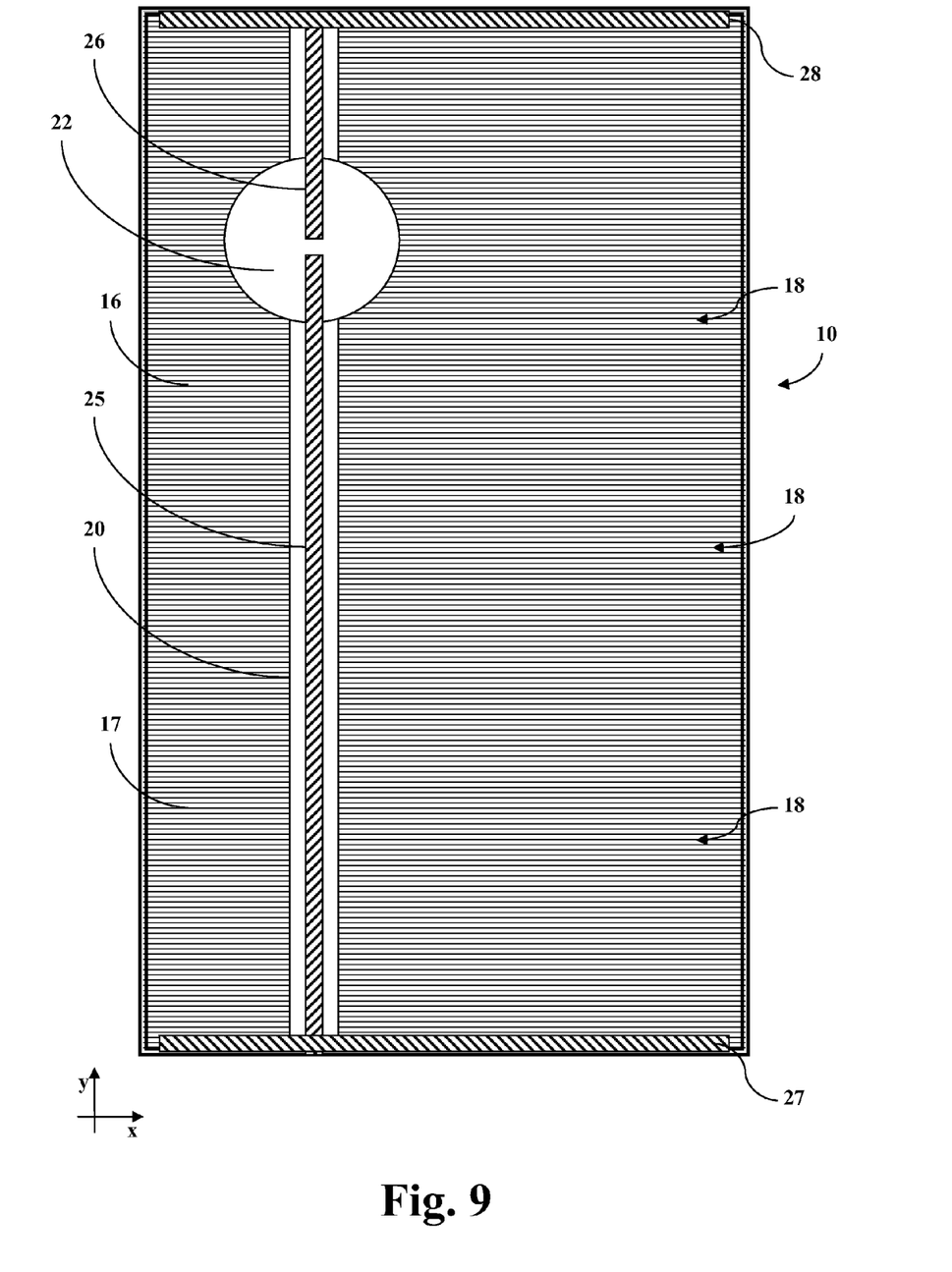
FIG. 9 shows a top view of the exemplary photovoltaic device of FIG. 8 with bus bars applied to opposite ends.

Bus bars 27, 28 can then be attached over opposite ends of the photovoltaic device 10. For example, the first bus bar 27 can overly the photovoltaic cell 17 positioned at the first end of the photovoltaic device 10, while the second bus bar 28 overlies the photovoltaic cell 17 at the second end of the photovoltaic device 10 opposite the first end. Since the photovoltaic cells 17 are connected to each other in series, the bus bars 27, 28 can serve as opposite electrical connections (e.g., positive and negative) on the photovoltaic device 10. Generally, the conductive strip 24 electrically connects the opposite electrical bus bars 27, 28 to the first lead 25 and the second lead 26.

The encapsulating substrate 14 can be adhered to the photovoltaic device 10 via an adhesive layer 30. The adhesive layer 30 is generally positioned over the conductive strip 24, intra-laminate disk layer 22, insulating layer 20, and any remaining exposed areas of the thin film layers 16. The adhesive layer 30 generally defines an adhesive gap 31 that generally corresponds to the connection aperture 15 defined by the encapsulating substrate 14. As such, the first lead 25 and second lead 26 can extend through the adhesive gap 31. The adhesive layer 30 can generally protect the thin film layers 16 and attach the encapsulating substrate 14 to the device 10. The adhesive layer 30 can be constructed from ethylene vinyl acetate (EVA), polyvinyl butyral (PVB), silicone based adhesives, or other adhesives which are configured to prevent moisture from penetrating the device.

FIG. 3 shows a junction box 32 configured to electrically connect the photovoltaic device 10 by completing the DC circuit. The junction box 32 can then provide a positive lead wire 33 and a negative lead wire 34 for further collection of the DC electricity produced by the photovoltaic device 10.

Figure 10:
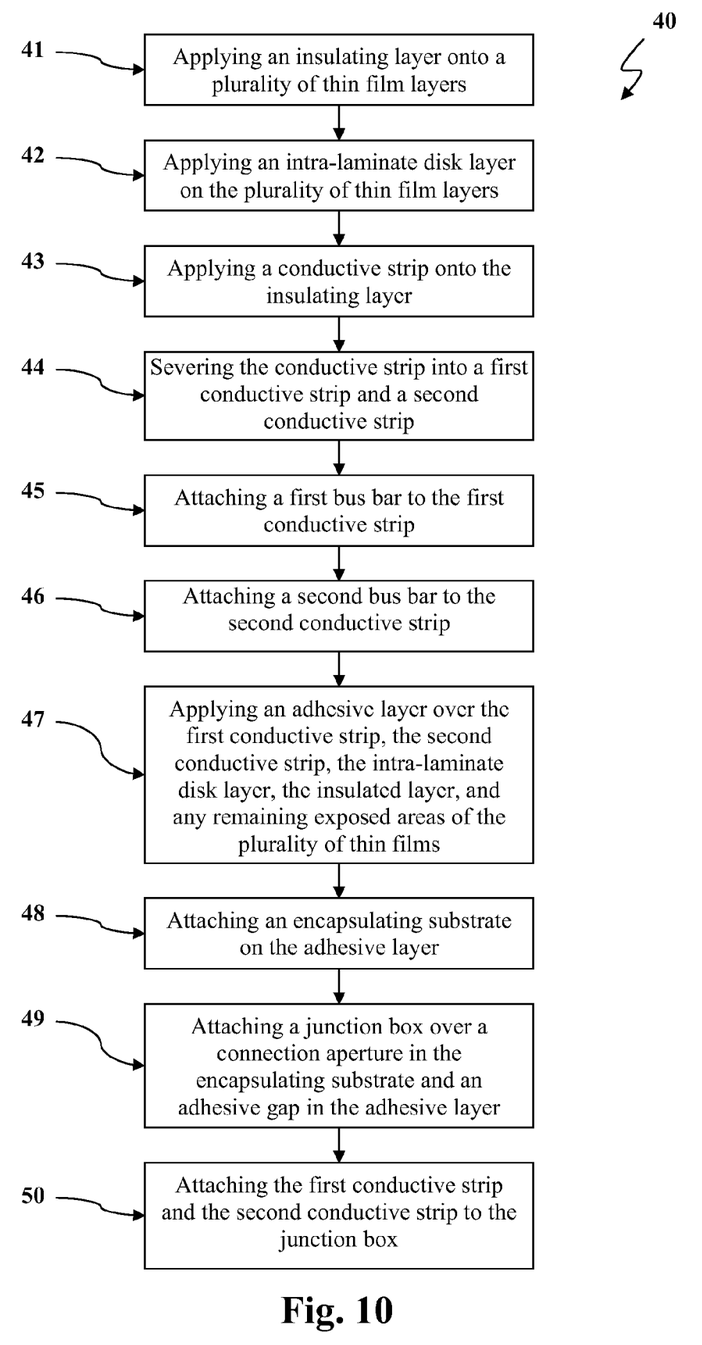
FIG. 10 shows a flow diagram of an exemplary method of forming the photovoltaic device of FIG. 3.
Figure 11:
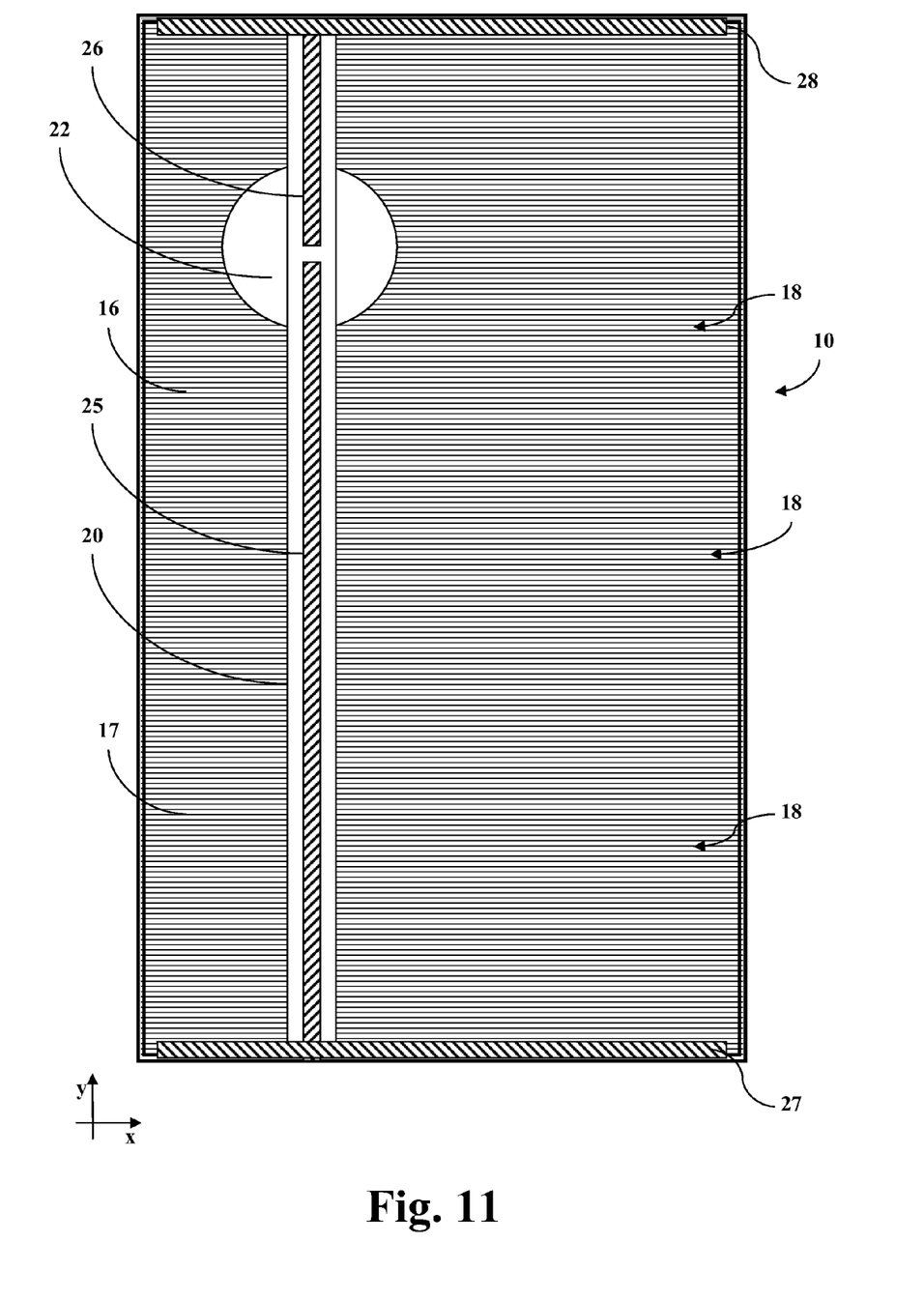
FIG. 11 shows a top view of an exemplary photovoltaic device according to another embodiment, such as used to construct the exemplary thin film photovoltaic device of FIG. 14.
Figure 12:
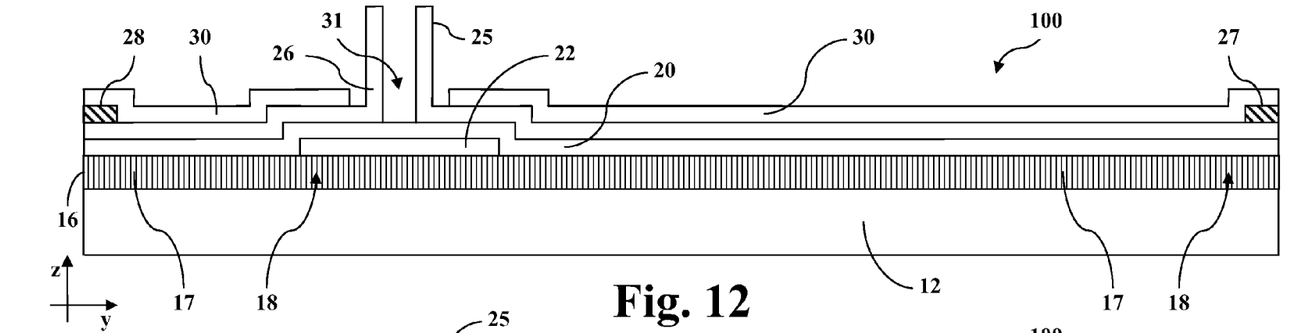
FIG. 12 shows a cross-sectional view of another exemplary thin film photovoltaic device according to one embodiment.
Figure 13:
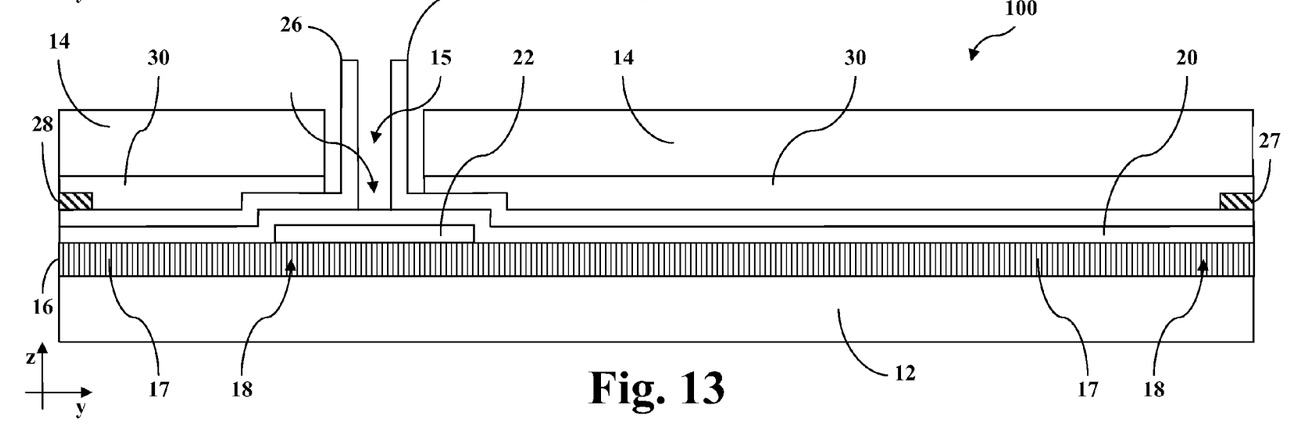
FIG. 13 shows a cross-sectional view of the exemplary thin film photovoltaic device of FIG. 12 having an encapsulating substrate attached; and, FIG. 14 shows a cross-sectional view of the exemplary thin film photovoltaic device of FIG. 13 having a junction box attached to the encapsulating substrate at its connection aperture.
Figure 14:
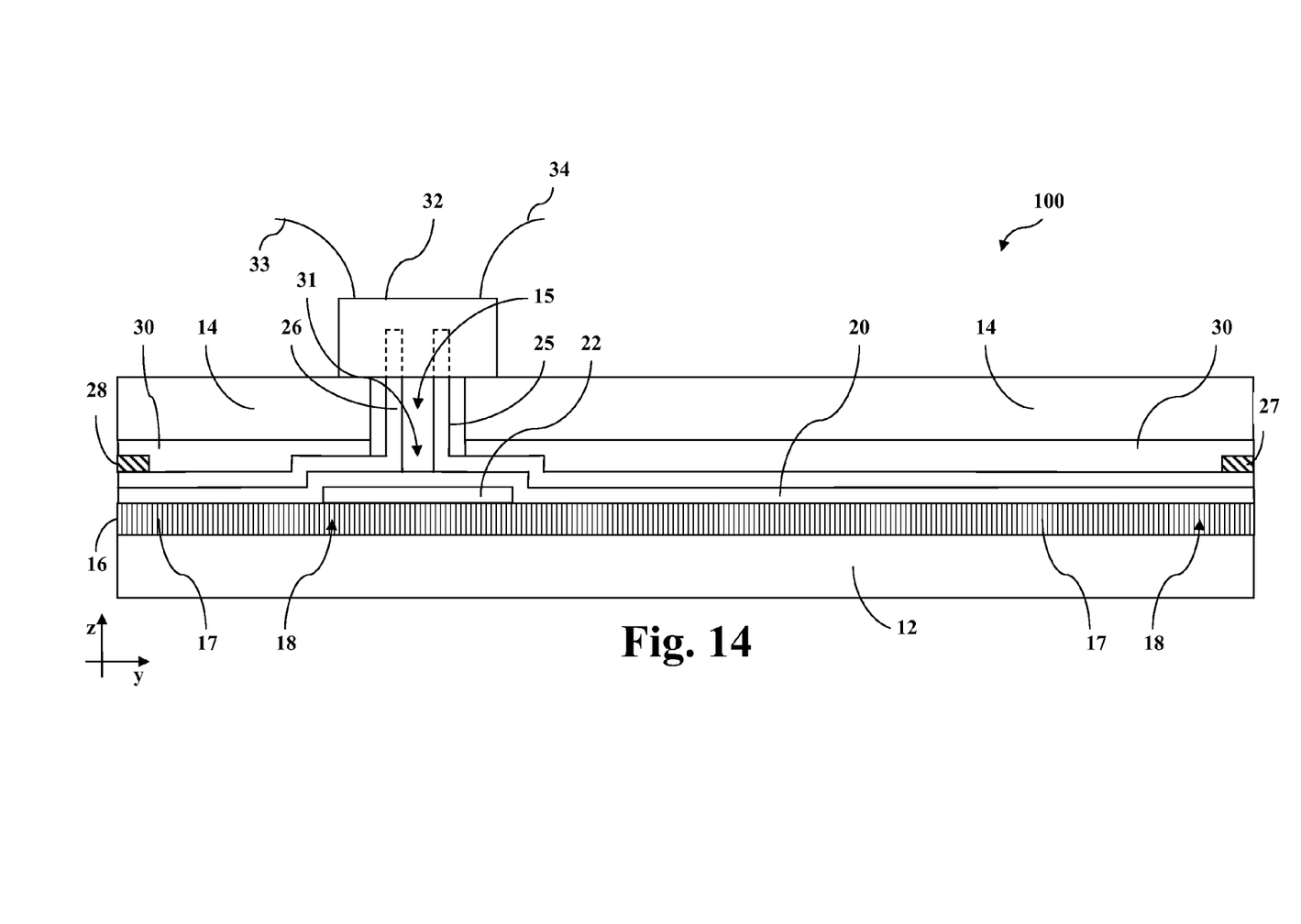

FIG. 10 generally shows a flow diagram of one exemplary method 40 for construction of the exemplary photovoltaic device 10 of FIG. 3. According to this method, an insulating layer is applied on plurality of thin film layers at 41, and an intra-laminate disk layer is applied on the plurality of thin film layers at 42. A conductive strip can then be applied on the insulating layer at 43, and severed into a first conductive strip and a second conductive strip at 44. A first bus bar can be attached to the first conductive strip at 45, and a second bus bar can be attached to the second conductive strip at 46. For instance, steps 41-46 of method 40 are exemplified sequentially in FIGS. 4-9.

Figure 1:
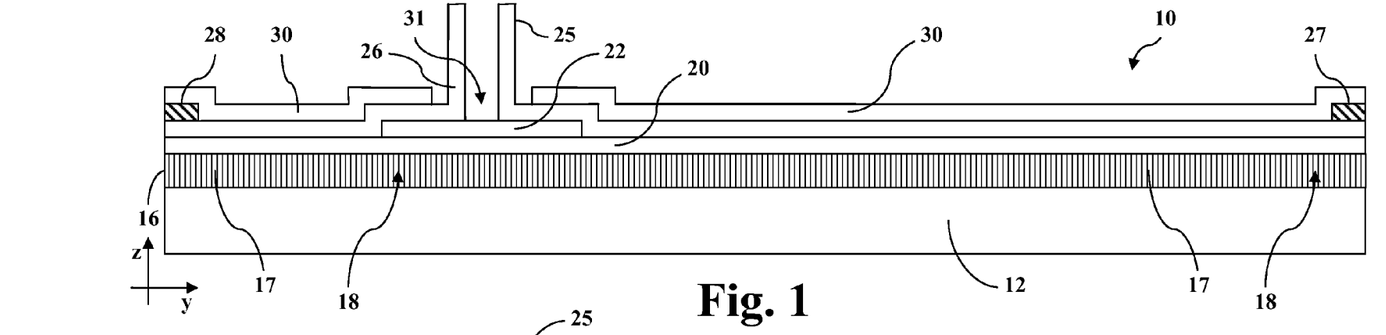
FIG. 1 shows a cross-sectional view of an exemplary thin film photovoltaic device according to one embodiment.
Figure 2:
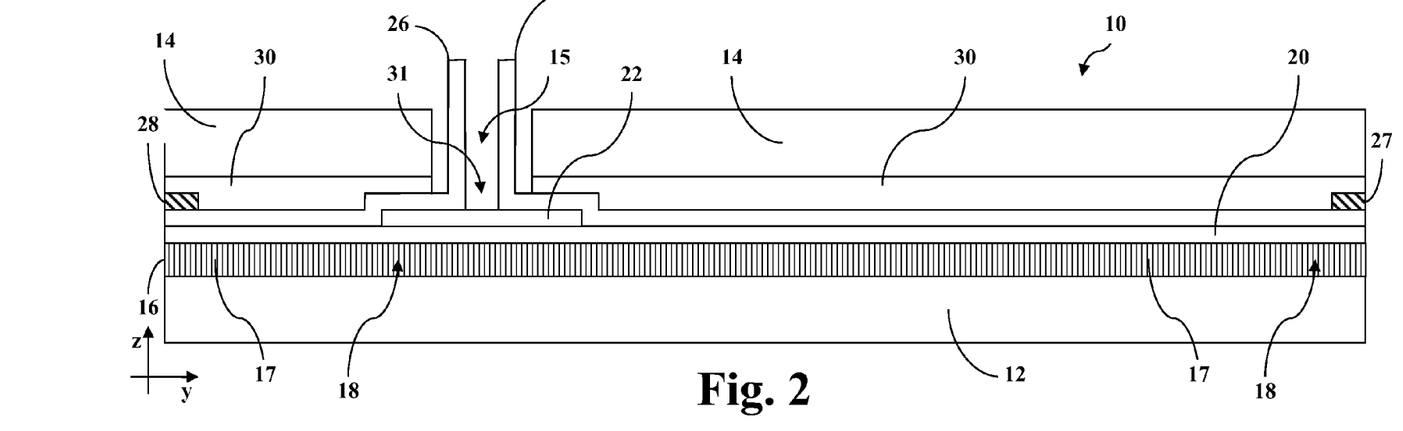
FIG. 2 shows a cross-sectional view of the exemplary thin film photovoltaic device of FIG. 1 having an encapsulating substrate attached.

Method 40 also includes attaching an adhesive layer, defining an adhesive gap, over the first conductive strip, the second conductive strip, the intra-laminate disk layer, the insulated layer, and any remaining exposed areas of the plurality of thin films at 47. An encapsulating substrate, defining a connection aperture, can be attached on the adhesive layer at 48. A junction box can be attached over the connection aperture and the adhesive gap at 49, and attached to the first conductive strip and the second conductive strip. For instance, steps 47-50 of method 40 are exemplified sequentially in FIGS. 1-3.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A photovoltaic device, comprising:
   a glass substrate;
   a plurality of thin film layers on the glass substrate, wherein the plurality of thin film layers define a plurality of photovoltaic cells connected in series to each other;
   an insulating layer positioned on and directly contacting the plurality of thin film layers;
   an intra-laminate disk layer positioned on and directly contacting the insulating layer;
   a first conductive strip positioned on and directly contacting the insulating layer and the intra-laminate disk layer, the first conductive strip defining a first lead, wherein the first conductive strip is electrically isolated from the plurality of thin film layers via the insulating layer and connected to a first bus bar;
   a second conductive strip positioned on and directly contacting the insulating layer and the intra-laminate disk layer, the second conductive strip defining a second lead, wherein the second conductive strip is electrically isolated from the thin film layers via the insulating layer and connected to a second bus bar;
   an adhesive layer over the first conductive strip, the second conductive strip, the intra-laminate disk layer, the insulated layer, and any remaining exposed areas of the plurality of thin films, wherein the adhesive layer defines an adhesive gap through which the first lead and the second lead extend; and,
   an encapsulating substrate on the adhesive layer, wherein the encapsulating substrate defines a connection aperture through which the first lead and the second lead extend,
   wherein the intra-laminate disk layer is positioned under the adhesive gap defined by the adhesive layer and the connection aperture defined by the encapsulating substrate.

2. The device of claim 1, wherein the intra-laminate disk layer is positioned on the insulating layer such that the intra-laminate disk layer is between the insulating layer and the first conductive strip and the second conductive strip.

3. The device of claim 1, wherein the intra-laminate disk layer extends over a protected area that is larger than the connection aperture defined by the encapsulating substrate.

4. The device of claim 1, wherein the intra-laminate disk layer extends over a protected area that is larger than the adhesive gap defined by the adhesive layer.

5. The device of claim 1, wherein the intra-laminate disk layer comprises a polymeric coating on a film.

6. The device of claim 5, wherein the polymeric coating defines both surfaces of the film.

7. The device of claim 5, wherein the polymeric coating comprises an ethylene-vinyl acetate copolymer.

8. The device of claim 5, wherein the film comprises a polymeric film.

9. The device of claim 1, wherein the intra-laminate disk layer defines a substantially circular disk.

10. The device of claim 9, wherein the intra-laminate disk layer is substantially centered with respect to the adhesive gap defined by the adhesive layer and the connection aperture defined by the encapsulating substrate.

11. The device of claim 10, wherein the disk has a disk diameter and the connection aperture defines an aperture diameter, and wherein the disk diameter is about 5% larger to about 200% larger than the aperture diameter.

12. The device of claim 1, wherein the intra-laminate disk layer defines a thickness of about 50 μm to about 400 μm.

13. The device of claim 1, further comprising:
    a junction box positioned on the encapsulating substrate and over the connection aperture, wherein the first lead and the second lead are connected to the junction box.

14. The device of claim 1, wherein the plurality of thin film layers comprises:
    a transparent conductive oxide layer on the glass substrate;
    a resistive transparent buffer layer on the transparent conductive oxide layer;
    an n-type layer on the resistive transparent buffer layer, wherein the n-type layer comprises cadmium sulfide;
    a p-type layer on the n-type layer, wherein the p-type layer comprises cadmium telluride; and,
    a back contact on the p-type layer.

* * * * *